United States Patent [19]

Gies

[11] 4,082,964
[45] Apr. 4, 1978

[54] DIODE SWITCH

[75] Inventor: Johannes Gies, Holzkirchen, Germany

[73] Assignee: Siemens Aktiengesellschaft, Berlin & Munich, Germany

[21] Appl. No.: 772,098

[22] Filed: Feb. 25, 1977

[30] Foreign Application Priority Data

Feb. 27, 1976 Germany .......................... 2608117

[51] Int. Cl.$^2$ ............................................. H03K 17/00
[52] U.S. Cl. ................................. 307/259; 307/256; 307/317 R
[58] Field of Search ............. 307/256, 255, 259, 31 R; 179/18 GF; 333/7 D

[56] References Cited

U.S. PATENT DOCUMENTS

| 3,126,488 | 3/1964 | Johnson | 307/259 |
| 3,666,892 | 5/1972 | Hestad | 307/259 |
| 3,881,066 | 4/1975 | Macrander et al. | 179/18 GF |

*Primary Examiner*—Stanley D. Miller, Jr.
*Assistant Examiner*—B. P. Davies
*Attorney, Agent, or Firm*—Hill, Gross, Simpson, Van Santen, Steadman, Chiara & Simpson

[57] ABSTRACT

The invention relates to a diode switch for the optional switch-through of an input-end signal to an output, in which two diodes, poled oppositely to one another, are arranged in the series arm and a third diode is arranged in the shunt arm of a four-pole, and wherein the different switching states are determined by the conductive state of the oppositely poled diodes and of the third diode, with a simultaneous blockage of the particular other diodes. The four-pole is preceded by an impedance transformer having a very low output resistance and is followed by a transformer having a very high input resistance. A first constant current source having a current strength of $J_1/2$ is connected after the output of the series arm diode; a second constant current source having a current strength of $J_1$ is connected to the nodal point of the diode with a polarity which is such that the oppositely poled diodes are each traversed by a current having a strength of $J_1/2$. On the disconnection of the second constant current source, a third constant current source is connected to the nodal point with a polarity which is such that the shunt arm diode is traversed by its current. Following the output and series arm diode during the connection of a third constant current source a blocking voltage is connected which is substantially matched to a bias voltage occurring at the output of the input and impedance transformer.

10 Claims, 3 Drawing Figures

4,082,964

DIODE SWITCH

FIELD OF THE INVENTION

The invention relates to a diode switch for the optional switch-through of an input-end signal to an output, in which two diodes, poles oppositely to one another, are arranged in the series arm and a third diode is arranged in the shunt arm of a four-pole, and wherein the different switching states are determined by the conductive state of the oppositely poled diodes and of the third diode, with a simultaneous blockage of the particular other diodes.

BACKGROUND OF THE INVENTION

A diode switch of this type is known from the magazine "Elektor", Sep. 1975-9-38, FIG. 3. The switching states of the diodes are in this case controlled via applied potentials which can themselves be changed by the optional closure of a circuit leading across a switching transistor in the shunt arm. However, a disadvantage consists in the fact that on account of the curvature of the diode curves, only very small input-end signal of e.g., a few mV can be transmitted with a sufficiently low distortion factor.

BRIEF SUMMARY OF THE INVENTION

It is an object of the invention to provide a diode switch in which the above mentioned disadvantage does not occur. This is achieved in accordance with the invention in that the four-pole is preceded by an impedance transformer having a very low output resistance, and is followed by an impedance transformer having a very high input resistance, that a first constant current source of the current strength $J_1/2$ is connected after the output-end series arm diode, that a second constant current source of the current strength $J_1$ can be connected to the nodal point of the diodes with a polarity which is such that the oppositely poles diodes are each traversed by a current of the strength $J_1/2$, that on the disconnection of the second constant current source, a third constant current source can be connected to the nodal point with a polarity which is such that the shunt arm diode is traversed by its current, and that following the output-end series arm diode, during the connection of the third constant current source, a blocking voltage is connected which is as far as possible matched to a bias voltage occurring at the output of the input-end impedance transformer.

The fundamental advantage which is achieved with the invention consists, in particular, in that it is possible to transmit, with low distortion, signals with a considerably greater amplitude than in the known diode switch. In addition, the limit value of the signal amplitude which can be transmitted in an undistorted fashion can be set in a simple fashion. By connecting in parallel two or more diode four-poles, it is also possible to realize more specialized switching functions such as, e.g., the optional switch-through of two or more signals connected to the individual four-pole inputs to an output which is common to all the four-poles.

THE DRAWINGS

In the following, the invention will be explained in detail making reference to a few preferred exemplary embodiments illustrated in the drawing, in which FIG. 1 illustrates the fundamental circuit of a diode switch in accordance with the invention, which serves to optionally switch-through an input-end signal to the four-pole output;

FIG. 2 is a more detailed illustration of a diode switch in the form of a change-over switch; and FIG. 3 illustrates an extension of the circuit in FIG. 2 for the optional switch-through of one of a plurality of input-end signals.

DETAILED DESCRIPTION OF PREFERRED EMBODIMENTS

Figure 1:
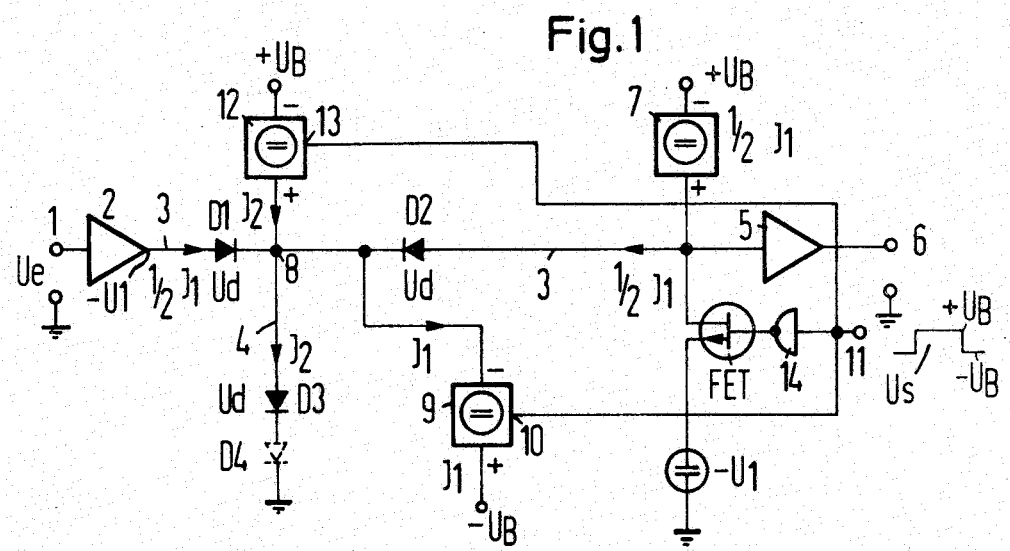

In FIG. 1, 1 designates the input of the diode switch which is connected by one pole to earth. Via this input one reaches a first impedance transformer 2, whose input resistance is matched to the circuit connected at 1, whereas its output resistance has a very low-ohmic value. The output of 2 is followed by a four-pole network whose series arm 3 contains two diodes D1, D2 poled oppositely to one another, whereas a diode D3 is arranged in the shunt arm 4. The four-pole network 3, 4 is followed by a second impedance transformer 5, whose input resistance is designed to have a very high-ohmic value, whereas its output resistance is selected to be such that it is matched to an output-end circuit to be connected to the switch output 6.

Between the output-end series arm diode D2 and the input of 5 there is arranged a first constant current source 7, which is connected by one pole to the positive operating voltage $+U_B$ which produces a constant current of the magnitude $J_1 12$. On the other hand, the nodal point 8 of the diodes D1 to D3 is connected to a second constant current source 9 which is constructed by one pole to the negative operating voltage $-U_B$ which can be connected via a control input 10 and in the switched-on state produces a current of the magnitude $J_1$. Constant current source 9 is switched on with a switching voltage Us which is fed via a terminal 11 to the control input 10 of the constant current source 9. The nodal point 8 is also wired to a third constant current source 12, which is connected by one pole to the positive operating voltage $+U_B$ and which constant current source 12 can be optionally switched on in dependence upon Us via the control input 13, and in the switched-on state produces the current $J_2$. Finally, the series arm 3 can be connected between the output-end diode D2 and the input of the second impedance transformer 5 with a blocking voltage $-U1$ which can be connected via a field effect transistor FET. The FET is also driven into the conductive state by the switching voltage Us which is fed from 11 via an inverter 14 to the control input gate of the FET.

If a signal Ue connected at 1 is now to be switched through to the output 6, the constant current source 9 is switched on, whereas the constant current source 12 remains disconnected. For this purpose, the control component of 9, which component is not shown in detail, is expediently designed in such a manner that the switched-on state is retained for such time as the high level $+U_B$ of Us prevails at the control input 10. The control component of 12 on the other hand, is designed in such a manner that the high level $+U_B$ at the control input 13 maintains the constant current source 12 in the disconnected state. As the constant current source 7 is always switched on, on the one hand, a current of the magnitude $J_1/2$ passes via 7, D2, 9 to $-U_B$ and, on the other hand, inevitably a current of the magnitude $J_1/2$ passes from the output of 2 via D1, 8 and 9 to $-U_B$, so that identical operation of D1 and D2 result. Consequently, a potential is set up at the nodal point 8, which is negative in relation to the bias voltage $-U1$ prevailing at the output of 2 by the voltage drop Ud across the diode D1 operated in the forward direction, whereas at the input of the impedance transformer 5 a potential is set up which corresponds to $-U1$. The diode D3 is blocked in accordance with the potential at 8. Assuming amplification factors of the value 1 for the impedance transformers 2 and 5, the signal Ue produces a corresponding voltage change at the output of 2, which change results in an equal voltage change at the input of 5 and thus at the output of 6. However, this does not involve a change in the operative points of the diodes D1 and D2 on account of the current impression of 7 and 9, and in fact the forward voltage Ud of D1 and D2 "float" on the input signal Ue impressed in low-ohmic fashion by 2. As 5 is high-ohmic, no current produced by Ue flows through D1 and D2 and thus Ue is transmitted in distortion-free fashion from the input 1 to the output 6. The only prerequisite is that the positive half wave of Ue should remain below a limit value which corresponds to the value of $2Ud+U1$ as otherwise D3 would be driven in the conductive state. By means of an appropriate setting of U1, however, this limit value can be fixed at a few volts in simple fashion. If, furthermore, one or more than one diode D4 is connected in series to D3, as shown in broken lines in FIG. 1, this limit value is in each case increased by the value of Ud. In this state of the diode switch the field effect transistor FET is blocked, which is achieved by converting the high level $+U_B$ of Us in 14 into a low level.

The blocked switching state, in which the output 6 of Ue is freed, is achieved when the constant current source 9 is disconnected and at the same time the constant current source 12 is switched on and the blocking voltage $-U1$ is connected via the FET to the series arm 3. With an appropriate design of the control components of 9 and 12, this is effected by switching over the level of Us to the value $-U_B$, where the level, inverted via 14, drives the FET into the conductive state. Here a current $J_2$ passes from 12 via 8, D3 and possibly D4 to earth, driving D3 into the transmission range. At the nodal point 8 arises a potential which is positive in relation to the earth potential by Ud, whereas the anodes of D1 and D2 are each fed with $-U1+Ue$ and $-U1$, so that D1 and D2 are blocked.

Thus, whereas in the conductive state of D1 and D2, a high-level low-noise and low-distortion transmission of Ue to the output 6 occurs, in the conductive state of D3, a high blocking attenuation of the switch occurs. In the event that the blocking voltage $-U1$ connected via the FET corresponds in value to the bias voltage present at the output of 2, Ue can also represent a DC signal. If AC signals Ue are to be switched through, the two aforesaid voltages need not agree exactly, if the DC components are suppressed in the impedance transformer 5.

Figure 2:
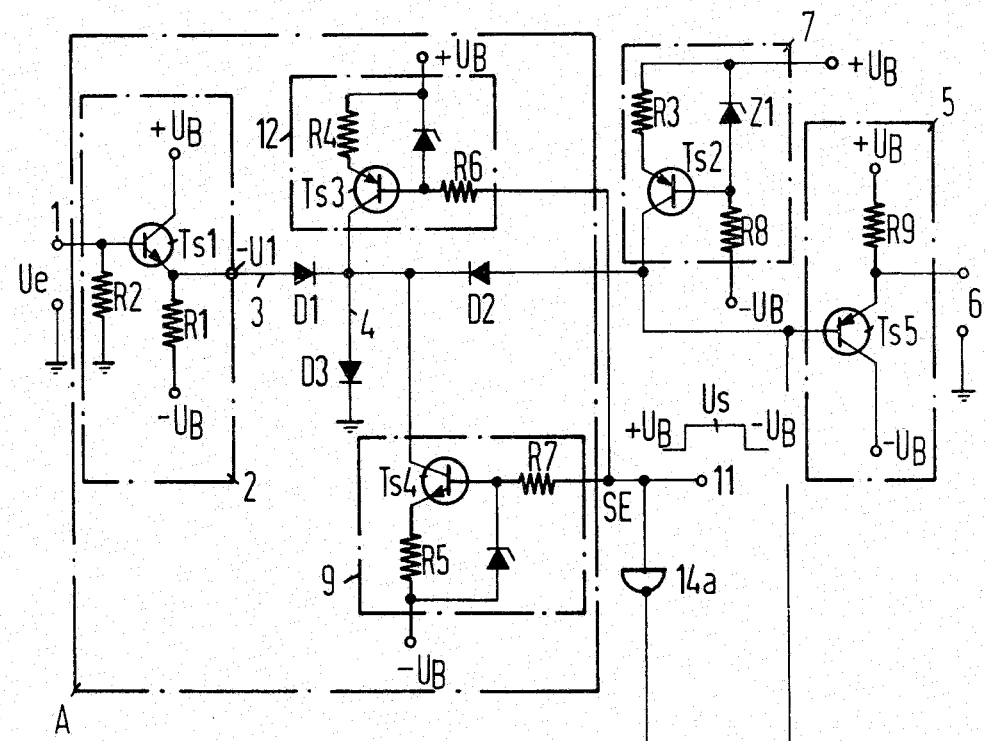
Figure 2:
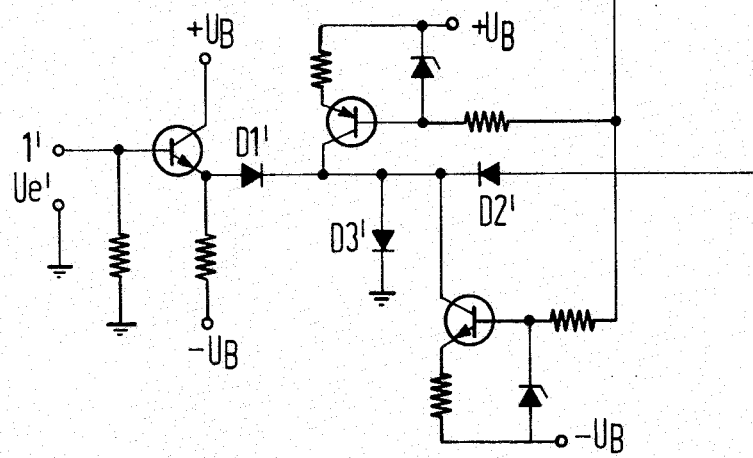

The upper part of FIG. 2 illustrated an advantageous circuitry design of the fundamental circuit in FIG. 1. As can be seen, the impedance transformer 2 is in the form of a transistor stage in a collector connection (emitter follower). Here an npn-transistor Ts is connected by its collector terminal to the operating voltage $+U_B$ and by its emitter terminal via an emitter resistor R1 to $-U_B$. Its base is connected via a resistor R2 to ground. The constant current sources 7, 9 and 12 consist of transistor stages in each case of similar construction. Thus, for example, the constant current source 7 contains a transistor Ts2, whose base leads via a zener diode A1 poled in the blocking direction to the positive operating voltage $+U_B$ to which the emitter is also connected via an emitter resistor R3.

On the other hand, the base of Ts2 is led via a resistor R8 to $-U_B$. The constant voltage falling across Z1 produces a fixed operative point of Ts2, so that its collector current is independent of load and constant. For the alternate switching on and off of the constant current sources 9 and 12 with the aid of the switching voltage Us fed via the terminal 11 and the control input SE, the transistor Ts3 is designed as a pnp-type and is connected via its emitter resistor R4 to $+U_B$, whereas Ts4 is designed as an npn-type and is connected via its emitter resistor R5 to $-U_B$. If the level $+U_B$ of Us is now fed via the terminal 11 to the constant current sources 9 and 12, interposing resistors R6 and R7 in the path of the switching voltage, Ts4 is opened whereas Ts3 is blocked. When a negative level $-U_B$ of Us is supplied, the reverse switching states result. Finally, the impedance transformer 5 consists of a transistor stage with the pnp-transistor Ts5 in a collector connection, the emitter of said transistor being connected via an emitter resistor R9 to $+U_B$ whereas its collector is connected to $-U_B$. The base of Ts5 is connected to the four-pole series arm 3. The emitter to Ts5 on the other hand is connected to the output 6 of the diode switch.

As a variation from the illustrated design of the constant current source, with appropriately raised values of the operating voltage $+U_B$ this can also be in the form of high-ohmic resistors.

In its lower half, FIG. 2 shows a circuit component which in construction corresponds fully to the upper circuit component and thus also to the circuit in FIG. 1, to the output of the four-pole network. Whereas each of these circuit components possesses a separate input 1, 1', to which a voltage Ue, Ue' to be switched through is in each case connected, their four-pole outputs are connected in parallel to one another, and lead to a common, output-end impedance transformer 5 and via the latter to the common output 6. If the switching voltage Us is fed to the lower circuit component via an inverter 14a, the following switching states result: If the level $+U_B$ of Us prevails, D1 and D2 are switched into the transmission range, in the manner already described, whereas D3 is blocked. At the same time, however, D3' is current-transmissive, whereas D1' and D2' are blocked. Thus U3 is transmitted from 1 to the output 6 in undistorted and virtually attenuation-free fashion, whereas Ue' is not transmitted. If the low level $-U_B$ of Us prevails at 11, Ue' is switched through to the output 6, whereas Ue is blocked. This gives rise to a double-throw switch which selectively switches through in each case one of two input-end signals Ue, Ue' to the common output 6. The cross-talk attenuation from the particular blocked input to the common output here is very considerable. It is also advantageous that the blocking voltage $-U1$, which in FIG. 1 was required to be separately connected via the FET to the series arm 3 of the four-pole, in FIG. 2 is in each case automatically produced by the potential conditions in the presently conductive channel of the double-throw switch, and is connected to the input of the impedance transformer 5.

Figure 3:
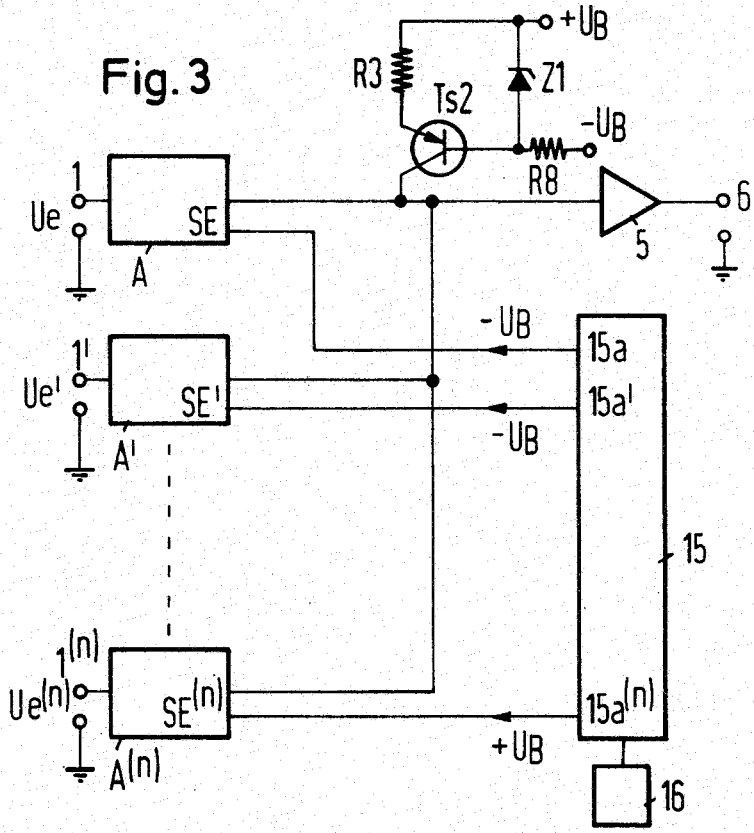

FIG. 3 illustrates how the circuit in FIG. 2 has been extended to comprise a switch-through of in each case one of a plurality of input signals to a common output 6. Here the circuit component A of FIG. 2 is contained n-times in FIG. 3 and is referenced A, A' to $A^n$. Whereas the inputs 1, 1' to $1^n$ are fed with the individual signals Ue, Ue' to Ue$^n$ which are to be switched through, the outputs of the circuit components A, A' to A$^n$ which in each case correspond to the individual four-pole outputs, are connected in parallel to one another and lead to the input of an output-end impedance transformer 5 which is common to all the said outputs. Then the particular signal which is to be switched through is tapped from an output 6 common to all the latter. The control inputs of the other sub-circuits, which inputs correspond to the control input SE of A, are referenced SE' to SE$^n$. Via its outputs 15a, 15a' to 15a$^n$ a logic circuit 15 in each case feeds the level +U$_B$ to one sub-circuit (in the illustrated situation 1$^n$), but feeds the level −U$_B$ to all the other sub-circuits. In this way, the signal Ue$^n$ of the sub-circuit fed with +U$_B$ is switched through to the output 6, whereas all the other input signals are blocked. The logic circuit 15 can, for example, be in the form of a switch which is operable via a signal generator 16 with a digital signal which in each case selects one of the n outputs and switches over the signal of this output, e.g., 15a$^n$ from the normally prevailing level −U$_B$ to +U$_B$.

It will be apparent to those skilled in the art that many modifications and variations may be effected without departing from the spirit and scope of the novel concepts of the present invention.

I claim as my invention:

1. A diode switch for the optional switch-through of an input-end signal to an output comprising a four-pole having a series arm which includes a first diode and a second diode oppositely poled to one another and a shunt arm which includes at least one diode connected to said series arm between said first and second diodes, an input impedance transformer having a relatively low output resistance ahead of said four-pole, an output impedance transformer having a relatively high input resistance connected to the output end of said second diode of said four-pole, the different switching states being determined by the conductive state of said diodes, a first constant current source connected between a positive voltage source and said connection between the output end of said second diode and an output terminal, a second constant current source connected between the nodal point between said first and second diodes and a negative voltage source, a control voltage terminal, said second constant current source having means for rendering it conductive by a control voltage applied from said control voltage terminal, a third constant current source connected between said nodal point and said positive voltage source, said third constant current source having means for rendering it nonconductive by a control voltage applied from said control voltage terminal, and circuit means for maintaining said first constant current means conducting at all times.

2. A diode switch as claimed in claim 1, in which a FET and a serially connected voltage bias source are connected between the output end of said second diode and a reference potential.

3. A diode switch as claimed in claim 2, in which a plurality of said four poles are arranged in parallel to one another, separate impedance transformers for each four-pole being provided through which input end signals may be selectively passed, a single output end impedance transformer, means for selectively connecting the output end of a selected four-pole of said output end impedance transformer.

4. A diode switch for the optional switch-through of an input-end signal to an output comprising a four-pole having a series arm which includes a first diode and a second diode oppositely poled to one another and a shunt arm which includes at least one diode connected to said series arm between said first and second diodes, the different switching states being determined by the conductive state of said oppositely poled diodes and of said third diode while selectively blocking one or another of said diodes, said four-pole being preceded by a first impedance transformer having relatively low output resistance and said four-pole followed by a second impedance transformer having a relatively high input resistance, a first constant current source having a current strength of $J_1/2$ being connected following the output end series arm second diode, a second constant current source having the current strength $J_1$ being connected to the nodal point of said three diodes with a polarity which is such that said oppositely poled first and second diodes are each traversed by a current of the strength $J_1/2$, a third constant current source being connected to said nodal point when said second constant current source is disconnected, said third constant current source having a polarity such that said third diode is traversed by its current $J_2$, and during the connection of said third constant current source the output end series arm diode is connected to a blocking voltage which is substantially matched to a bias voltage occurring at the output of said input-end impedance transformer.

5. A diode switch as claimed in claim 4, in which two four-poles are provided which are each fed via separate impedance transformers with input-end signals, said four-poles being connected in parallel to one another, a signal output end impedance transformer, said four-poles being connected to the input of a common output-end impedance transformer, and the second and third constant current sources of each four-pole being alternately switched on.

6. A diode switch as claimed in claim 4, in which the outputs of a plurality of four-poles which are each fed via separate impedance transformers with input-end signals are connected in parallel to one another and are connected to the input of a common output-end impedance transformer, and said second constant current source of a selectable four-pole being in each case switchable on while its associated third constant current source is switched off, and the second constant current sources of the other four-poles being switched off and their associated third constant current sources are switched on.

7. A diode switch as claimed in claim 4, in which said constant current sources are constructed as transistor stages, whose emitters are connected to the operating voltage via predetermined emitter resistors, and whose base terminals are connected thereto via zener diodes poled in the blocking direction.

8. A diode switch as claimed in claim 7, in which said third diode arranged in the four-pole shunt arm is supplemented by the series connection of at least one additional diode.

9. A diode switch as claimed in claim 7, in which said input-end impedance transformer is designed as an npn-transistor stage in a collector connection, and said output-end impedance transformer is designed as a pnp-transistor stage in a collector connection.

10. A diode switching circuit for the selective switch-through of an input end signal to an output comprising a first and a second diode serially connected in oppositely poled relation to each other to form the series arm of a four-pole having a nodal point therebetween, a third diode connected between the nodal point between said first and second diodes and ground, said third diode forming the shunt arm of said four-pole, input terminal means, output terminal means, a first impedance transformer connected between said first diode and said input terminal means, said first impedance transformer having an input resistance matched to the circuit supplying the input signal and a very low output resistance, followed by a four-pole having a high input resistance, a first constant current source having a current strength of $J_1/2$ connected following said second diode, a second constant current source having a current strength of $J_1$ connected to said nodal point with a polarity such that the oppositely poled first and second diodes are each traversed by a current of the strength $J_1/2$, and third constant current source to be connected to said nodal point with a polarity such that said third diode is traversed by its current $J_2$, during the connection of said third constant current source, the said second diode having a blocking voltage connected thereto which voltage is substantially matched to a bias voltage occurring at the output of said first impedance transformer.

* * * * *